(12) United States Patent
Jee

(10) Patent No.: US 8,962,984 B2
(45) Date of Patent: Feb. 24, 2015

(54) SOLAR CELL APPARATUS AND MANUFACTURING METHOD THEREOF

(75) Inventor: Suk Jae Jee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/381,778

(22) PCT Filed: Mar. 24, 2011

(86) PCT No.: PCT/KR2011/002046
§ 371 (c)(1),
(2), (4) Date: Dec. 30, 2011

(87) PCT Pub. No.: WO2011/119001
PCT Pub. Date: Sep. 29, 2011

(65) Prior Publication Data
US 2013/0008496 A1     Jan. 10, 2013

(30) Foreign Application Priority Data

Mar. 24, 2010   (KR) .................. 10-2010-0026380

(51) Int. Cl.
*H01L 27/142* (2014.01)

(52) U.S. Cl.
CPC ............. *H01L 27/1425* (2013.01); *Y02E 10/50* (2013.01)
USPC ....................... 136/256; 257/E31.124; 438/98

(58) Field of Classification Search
CPC . H01L 31/0216; H01L 31/18; H01L 27/1425; Y02E 10/50
USPC .............. 136/259, 256; 257/E31.124; 438/98
See application file for complete search history.

(56) References Cited

U.S. PATENT DOCUMENTS

| 7,141,863 | B1 * | 11/2006 | Compaan et al. ............. 257/530 |
| 2007/0131271 | A1 * | 6/2007 | Lim et al. ...................... 136/244 |
| 2009/0014052 | A1 * | 1/2009 | Borden et al. ................. 136/244 |
| 2010/0059100 | A1 |  3/2010 | Kim et al. |
| 2010/0147384 | A1 * | 6/2010 | Lerchenberger et al. ..... 136/261 |
| 2011/0011451 | A1 * | 1/2011 | Hakuma et al. ............... 136/255 |
| 2011/0023963 | A1 |  2/2011 | Ishizuka et al. |

FOREIGN PATENT DOCUMENTS

| CN | 1866546 A | 11/2006 |
| JP | 48-26977 | 8/1973 |
| JP | 59-220979 | 12/1984 |
| JP | 2002-094089 A | 3/2002 |
| JP | 2009-135517 A | 6/2009 |
| KR | 10-2010-0025429 A | 3/2010 |

(Continued)

OTHER PUBLICATIONS

Hakuma et al., WO-2009110093 A1, English machine translation, Sep. 2009, PCT, pp. 1-20.*

(Continued)

*Primary Examiner* — Jeffrey T Barton
*Assistant Examiner* — Tae-Sik Kang
(74) *Attorney, Agent, or Firm* — Saliwanchik, Lloyd & Eisenschenk

(57) ABSTRACT

Disclosed is a solar cell apparatus and manufacturing method thereof. A solar cell apparatus includes: a support substrate; a first back electrode disposed on the support substrate; a light absorber part disposed on the first back electrode; a buffer disposed on the light absorber part; and a barrier film disposed on a side surface of the light absorber part and extending from the buffer.

8 Claims, 5 Drawing Sheets

(56) References Cited

FOREIGN PATENT DOCUMENTS

| KR | 10-2010-0026710 A | 3/2010 | | |
|----|---|---|---|---|
| WO | WO-2009/116626 A1 | 9/2009 | | |
| WO | WO 2009110093 A1 | * | 9/2009 | .............. H01L 31/04 |

OTHER PUBLICATIONS

International Search Report in International Application No. PCT/KR2011/002046, filed Mar. 24, 2011.

Notice of Allowance dated Oct. 17, 2012 in Korean Application No. 10-2010-0026380, filed Mar. 24, 2010.

Office Action dated Sep. 14, 2011 in Korean Application No. 10-2010-0026380, filed Mar. 24, 2010.

Friedrich Kessler, et al., Technological Aspects of Flexible Cigs Solar Cells and Modules, Solar Energy, 2004, 685-698, 77, Elsevier.

European Search Report in European Application No. 11759750-1508, dated Dec. 11, 2013.

Office Action dated Aug. 19, 2014 in Japanese Application No. 2013-501193.

Office Action dated Sep. 28, 2014 in Chinese Application No. 201180015276.1.

\* cited by examiner

SOLAR CELL APPARATUS AND MANUFACTURING METHOD THEREOF

CROSS-REFERENCE TO RELATED APPLICATIONS

This application is the U.S. national stage application of International Patent Application No. PCT/KR2011/002046, filed Mar. 24, 2011, which claims priority to Korean Application No. 10-2010-0026380, filed Mar. 24, 2010, the disclosures of each of which are incorporated herein by reference in their entirety.

BACKGROUND

The present invention relates to a solar cell apparatus and manufacturing method thereof.

As demand for energy increases, solar cells for converting solar energy into electrical energy are being actively developed.

Particularly, copper-indium-gallium-selenide-based (CIGS-based) solar cells which are p-n hetero-junction apparatuses having a substrate structure are being widely used. Herein, the substrate structure includes a glass substrate, a metal back electrode layer, a p-type CIGS-based light absorption layer, a high resistance buffer layer, and an n-type window layer.

SUMMARY

Embodiments provide a solar cell apparatus which suppresses leakage current and has an enhanced photoelectric conversion efficiency, and manufacturing method thereof.

In one embodiment, a solar cell apparatus includes: a support substrate; a first back electrode disposed on the support substrate; a light absorber part disposed on the first back electrode; a buffer disposed on the light absorber part; and a barrier film disposed on a side surface of the light absorber part and extending from the buffer.

In another embodiment, a solar cell apparatus includes: a support substrate; a back electrode layer disposed on the support substrate; a light absorption layer disposed on the back electrode layer and having a through groove formed therein; a buffer layer disposed on a top surface of the light absorption layer and an inner surface of the through groove; and a window layer disposed on the buffer layer.

In a further embodiment, a method of manufacturing a solar cell apparatus according to a further embodiment includes: forming a back electrode layer on a support substrate; forming a light absorption layer on the back electrode layer; forming a through groove on the light absorption layer; forming a buffer layer on a top surface of the light absorption layer and an inner surface of the through groove; and forming an open region on the buffer layer, the open region exposing the back electrode layer and partially overlapping the through groove.

The details of one or more embodiments are set forth in the accompanying drawings and the description below. Other features will be apparent from the description and drawings, and from the claims.

DETAILED DESCRIPTION OF THE EMBODIMENTS

In the description of embodiments, it will be understood that when a substrate, film, electrode, groove, or layer is referred to as being 'on' or 'under' another substrate, film, electrode, groove, or layer, the terminology of 'on' and 'under' includes both the meanings of 'directly' and 'indirectly'. Further, the reference about 'on' and 'under' each component will be made on the basis of drawings. In addition, the sizes of elements and the relative sizes between elements may be exaggerated for further understanding of the present disclosure.

Figure 1:
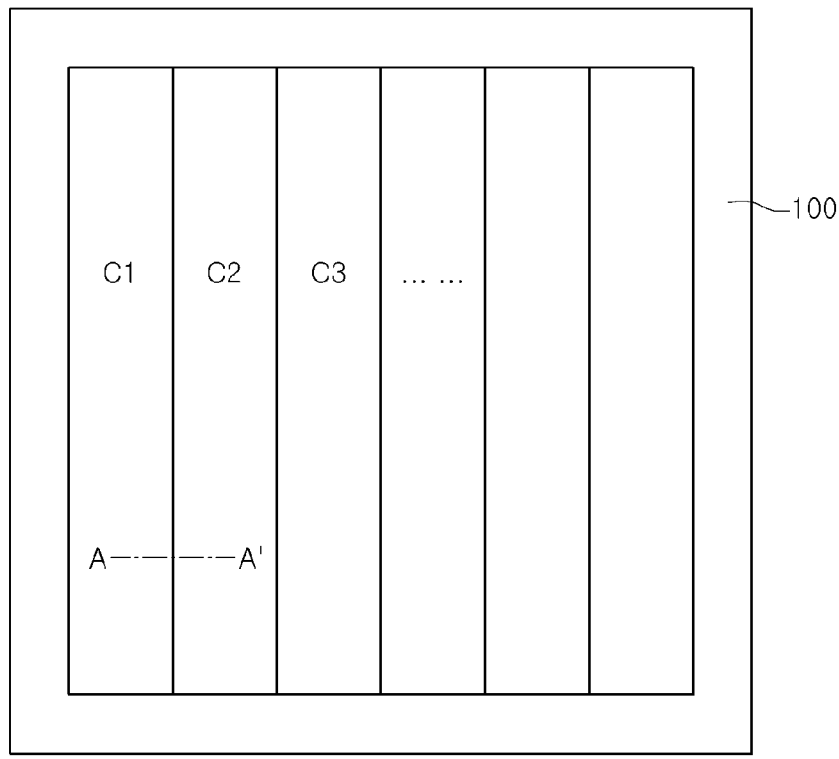
FIG. 1 is a plane view illustrating a solar cell apparatus according to an embodiment.
Figure 2:
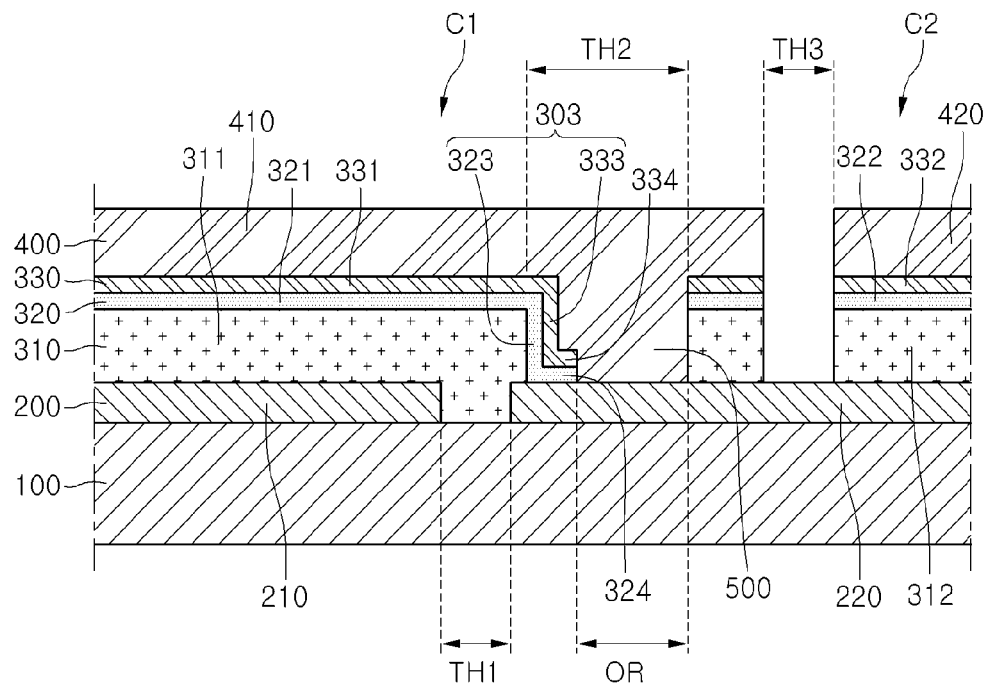
FIG. 2 is a cross-sectional view taken along line A-A' of FIG. 1.

FIG. 1 is a plane view illustrating a solar cell apparatus according to an embodiment. FIG. 2 is a cross-sectional view taken along line A-A' of FIG. 1.

Referring to FIGS. 1 and 2, the solar cell apparatus includes a support substrate 100, a back electrode layer 200, a light absorption layer 310, a first buffer layer 320, a second buffer layer 330, a barrier film 303, a window layer 400, and a connector part 500.

The support substrate 100 has a plate shape and supports the back electrode layer 200, the light absorption layer 310, the first buffer layer 320, the second buffer layer 330, the window layer 400, and the connector part 500.

The support substrate 100 may be an electrical insulator. The support substrate 100 may be a glass substrate, a plastic substrate, or a metal substrate. In more detail, the support substrate 100 may be a soda lime glass substrate. The support substrate 100 may be transparent. The support substrate 100 may be rigid or flexible.

The back electrode layer 200 is disposed on the support substrate 100. The back electrode layer 200 is a conductive layer. For example, the back electrode layer 200 may be formed of a metal such as molybdenum.

Moreover, the back electrode layer 200 may include two or more layers. In this case, the two or more layers may be formed of the same metal or different metals.

A first through groove TH1 is formed in the back electrode layer 200. The first through groove TH1 is an open region exposing the top surface of the support substrate 100. The first through groove TH1 may extend in one direction in terms of a plan view.

The first through groove TH1 may have a width of about 80 μm to about 200 μm.

Figure 3:
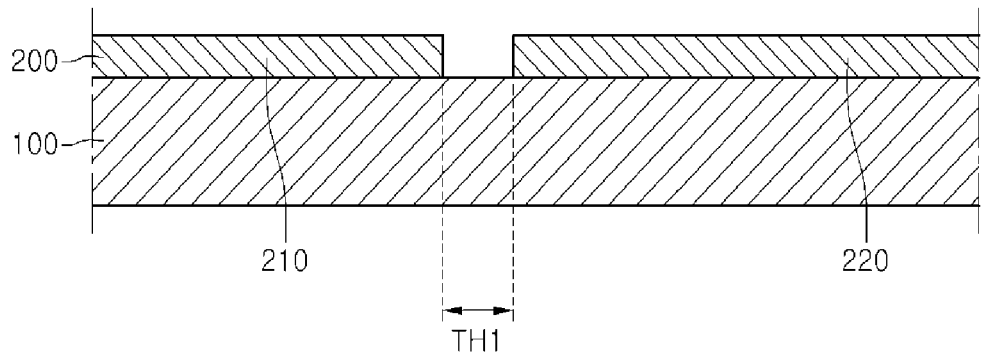
FIGS. 3 to 7 are cross-sectional views illustrating a method of manufacturing a solar cell apparatus according to an embodiment.

The first through groove TH1 divides the back electrode layer 200 into a plurality of back electrodes 210, 220, . . . . That is, the first through groove TH1 defines the plurality of back electrodes 210, 220, . . . . In FIG. 3, a first back electrode 210 and a second back electrode 220 of the back electrodes 210, 220, . . . are shown.

The back electrodes 210, 220, . . . are separated from each other by the first through groove TH1. The back electrodes 210, 220, . . . are disposed in a stripe shape.

Alternatively, the back electrodes 210, 220, . . . may be disposed in a matrix shape. In this case, the first through groove TH1 may have a lattice shape in terms of a plan view.

The light absorption layer 310 is disposed on the back electrode layer 200. And also, the first through groove TH1 is filled with a material forming the light absorption layer 310.

The light absorption layer 310 includes group I-III-VI compounds. For example, the light absorption layer 310 may have a copper-indium-gallium-selenide (Cu(In,Ga)Se$_2$)-based (CIGS-based) crystal structure, a copper-indium-selenide-based crystal structure, or a copper-gallium-selenide-based crystal structure.

The light absorption layer 310 may have an energy band gap of about 1 eV to about 1.8 eV.

A second through groove TH2 is formed in the light absorption layer 310. The second through groove TH2 passes through the light absorption layer 310. And also, the second through groove TH2 is an open region exposing the top surface of the back electrode layer 200.

The second through groove TH2 is adjacent to the first through groove TH1. That is, the second through groove TH2 is parallel to the first through groove TH1 in terms of a plan view.

The second through groove TH2 may have a width of about 80 μm to about 200 μm.

And also, the light absorption layer 310 defines a plurality of light absorber parts 311, 312, . . . with the second through groove TH2. That is, the light absorption layer 310 is divided into the plurality of light absorber parts 311, 312, . . . by the second through groove TH2.

The first buffer layer 320 is disposed on a top surface of the light absorption layer 310 and an inner surface of the second through groove TH2. The first buffer layer 320 includes cadmium sulfide (CdS) and has an energy band gap of about 2.2 eV to about 2.4 eV.

The second buffer layer 330 is disposed on the first buffer layer 320. And also, the second buffer layer 330 may be disposed on the inner surface of the second through groove TH2. The second buffer layer 330 includes impurity-undoped zinc oxide (i-ZnO). The second buffer layer 330 has an energy band gap of about 3.1 eV to about 3.3 eV.

The first buffer layer 320 and the second buffer layer 330 perform a buffer function between the light absorption layer 310 and the window layer 400. And also, only the first buffer layer 320 may be disposed between the light absorption layer 310 and the window layer 400 and perform a buffer function independently. Alternatively, only the second buffer layer 330 may be disposed between the light absorption layer 310 and the window layer 400 and perform a buffer function independently.

The first buffer layer 320 is divided into a plurality of lower buffers 321, 322, . . . , a first barrier film 323, and a first dummy part 324 by an open region OR overlapping the second through groove TH2.

Likewise, the second buffer layer 330 is divided into a plurality of upper buffers 331, 332, . . . , a second barrier film 333, and a second dummy part 334 by an open region OR.

The open region OR partially removes the first buffer layer 320 and the second buffer layer 330 to expose the top surface of the back electrode layer 200.

The first barrier film 323 extends from a first lower buffer 321 disposed on the first light absorber part 311 and is disposed on the side surface of the first light absorber part 311. The first barrier film 323 is formed integrally with the first lower buffer 321 and is disposed between the side surface of the first light absorber part 311 and the second barrier film 333.

The first dummy part 324 extends from the first barrier film 323 along the top surface of the back electrode layer 200. In more detail, the first dummy part 324 extends from the first barrier film 323 and is contact with the top surface of a second back electrode layer 220. The first dummy part 324 is formed integrally with the first barrier film 323.

The second barrier film 323 extends from a first upper buffer 331 disposed on the first lower buffer 321 and is disposed on the first barrier film 323. The second barrier film 333 is formed integrally with the first upper buffer 331 and is disposed between the first barrier film 323 and the first connector part 500.

The second barrier film 333 has a high resistance, like the first upper buffer 331.

The second dummy part 334 extends from the second barrier film 333 along the top surface of the back electrode layer 200. In more detail, the second dummy part 334 extends from the second barrier film 333 and is contact with the top surface of the first dummy part 324. The second dummy part 334 is formed integrally with the second barrier film 333.

In this way, the first barrier layer 323 and the second barrier film 333 constitute the barrier film 303. That is, the barrier film 303 extends from the lower buffers 321, 322, . . . and the upper buffers 331, 332, . . . , and is disposed on the side surface of the light absorber parts 311, 312, . . . .

Likewise, the first dummy part 324 and the second dummy part 334 constitute a dummy part. The dummy part extends from the barrier film 303 along the top surface of the back electrode layer 200.

The window layer 400 is disposed on the second buffer layer 330. The window layer 400 is a transparent electrical conductive layer. The resistance of the window layer 400 is higher than that of the back electrode layer 200. For example, the window layer 400 has a resistance about 10 to 200 times higher than the back electrode layer 200. For example, the window layer 400 may be formed of an Al doped zinc oxide (AZO).

A third through groove TH3 is formed in the window layer 400. The third through groove TH3 is an open area exposing the top surface of the back electrode layer 200. For example, the third through groove TH3 may have a width of about 80 μm to about 200 μm.

The third through groove TH3 is adjacent to the second through groove TH2. In more detail, the third through groove TH3 is disposed next to the second through groove TH2. That is, the third through groove TH3 is parallel to the second through groove TH2 in terms of a plan view.

The third through groove TH3 divides the window layer 400 into a plurality of windows 410, 420, . . . . That is, the third through groove TH3 defines the windows 410, 420, . . . .

The windows 410, 420, . . . have a shape corresponding to the back electrodes 210, 220, . . . . That is, the windows 410, 420, . . . are disposed in a stripe shape. Alternatively, the windows 410, 420, . . . may be disposed in a matrix shape.

And also, the third through groove TH3 defines a plurality of cells C1, C2, . . . . In more detail, the cells C1, C2, . . . are defined by the second through groove TH2 and the third through groove TH3. That is, a solar cell apparatus according to an embodiment is divided into the cells C1, C2, . . . by the second through groove TH2 and the third through groove TH3.

That is, the solar cell apparatus according to an embodiment includes the plurality of cells C1, C2, . . . . For example, the solar cell apparatus according to an embodiment includes a first cell C1 and a second cell C2 disposed on the support substrate 100.

The first cell C1 includes the first back electrode 210, the first light absorber part 311, the first lower buffer 321, the first upper buffer 331, and the first window 410.

The first back electrode 210 is disposed on the support substrate 100. The first light absorber part 311, the first lower buffer 321, and the first upper buffer 331 are stacked on the first back electrode 210 sequentially. The first window 410 is disposed on the first upper buffer 331.

That is, the first back electrode 210 and the first window 410 face each other with the first light absorber part 311 therebetween.

Although not illustrated in the drawings, the first light absorber part 311 and the first window 410 cover the first back electrode 210 with the top surface thereof being partially exposed.

The second cell C2 is disposed adjacent to the first cell C1 on the support substrate 100. The second cell C2 includes the second back electrode 220, the second light absorber part 312, the second lower buffer 322, the second upper buffer 332, and the second window 420.

The second back electrode 220 is disposed spaced apart from the first back electrode 210 on the support substrate 100. The second light absorber part 312 is disposed spaced apart from the first light absorber part 311 on the second back electrode 220. The second window 420 is disposed spaced apart from the first window 410 on the second upper buffer 332.

The second light absorber part 312 and the second window 420 cover the second back electrode 220 with the top surface thereof being partially exposed.

The connector part 500 is disposed on the inner surface of the second through groove TH2.

The connector part 500 extends downward from the window layer 400, and is direct contact with the back electrode layer 200. For example, the connector part 500 extends downward from the first window 410, and is direct contact with the second back electrode 220.

Accordingly, the connector part 500 connects a back electrode and a window which are included in each of the adjacent cells C1, C2, . . . . That is, the connector part 500 connects the first window 410 with the second back electrode 220.

The connector part 500 is formed integrally with the windows 410, 420, . . . . That is, the connector part 500 and the window layer 400 are formed of the same material.

The barrier film 303 insulates the side surfaces of the light absorber parts 311, 312, . . . . That is, the barrier film 303 is disposed between the light absorber part 311, 312, . . . and the connector parts 500, respectively. Thus, the barrier film 303 may block leakage currents from the side surfaces of the light absorber parts 311 and 132. For example, the barrier film 303 may prevent a current from leaking from the connector part 500 through the side surface of the first light absorber part 311 to the first back electrode 210.

To block the leakage current, it is not necessary to increase the width of the first through groove TH1. That is, although decreasing the width of the first through groove TH1, the leakage current can be efficiently blocked by the barrier film 333.

Thus, the solar cell apparatus according to an embodiment can decrease the width of the first through groove TH1 and reduce a dead zone where the power generation is impossible.

Accordingly, the solar cell apparatus according to an embodiment has an enhanced efficiency of power generation.

FIGS. 3 to 7 are cross-sectional views illustrating a method of manufacturing a solar cell apparatus according to an embodiment. A description of the method refers to the previous description of the solar cell apparatus.

Referring to FIG. 3, a back electrode layer 200 is formed on a support substrate 100. And also, the back electrode layer 200 is patterned to form a first through groove TH1. Thus, a plurality of back electrodes 210, 220, . . . are formed on the support substrate. The back electrode layer 200 is patterned with a laser.

The first through groove TH1 may expose the top surface of the support substrate 100 and have a width of about 80 μm to about 200 μm.

And also, additional layer such as a diffusion barrier film may be disposed between the support substrate 100 and the back electrode layer 200. In this case, the first through groove TH1 exposes the top surface of the additional layer.

Figure 4:
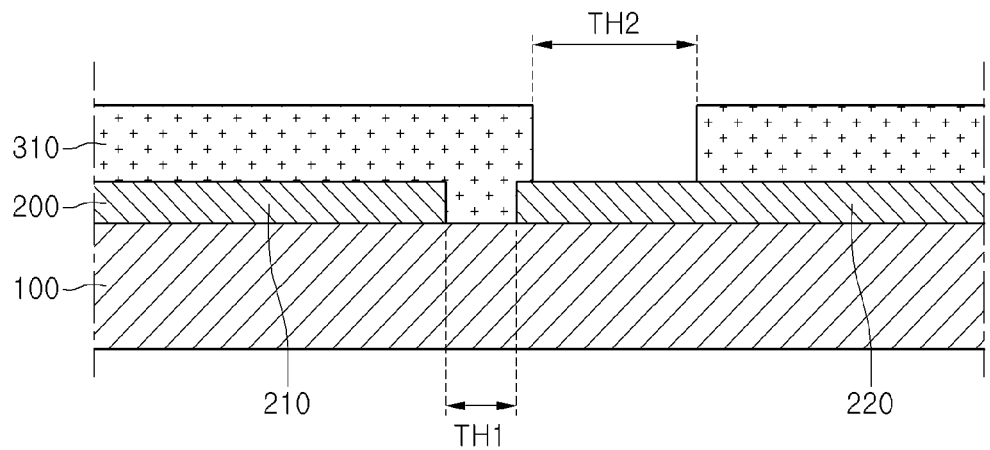

Referring to FIG. 4, a light absorption layer 310 is formed on the back electrode layer 200.

The light absorption layer 310 may be formed using a sputtering process or an evaporation method.

For example, the light absorption layer 310 of a copper-indium-gallium-selenide $(Cu(In,Ga)Se_2)$-based (CIGS-based) semiconductor compound may be formed by a method of simultaneously or separately evaporating copper, indium, gallium, and selenide or of forming a metal precursor film and then using a selenization process.

In more detail of the method of forming a metal precursor film and then using a selenization process, the metal precursor film is formed on the back electrode 200 a metal precursor film through a sputtering process using a copper target, an indium target, and a gallium target.

Hereinafter, the light absorption layer 310 of a copper-indium-gallium-selenide $(Cu(In,Ga)Se_2)$-based (CIGS-based) semiconductor compound is formed through a selenization process using the metal precursor film.

Alternatively, the sputtering process using a copper target, an indium target, and a gallium target, and the selenization process may be simultaneously performed.

Alternatively, a sputtering process using a copper target and an indium target or using a copper target and a gallium target, and the selenization process may be performed to form a light absorption layer 310 of a CIS or CIG-based semiconductor compound.

The light absorption layer 310 is partially removed to form a second through groove TH2.

The second through groove TH2 may be formed using a mechanical device such as a tip, or a laser device.

For example, the light absorption layer 310 and the first buffer layer 320 may be patterned using a tip having a width of about 40 μm to about 180 μm. The second through groove TH2 may be formed using a laser device having a wavelength of about 200 nm to about 600 nm.

In this case, the second through groove TH2 may have a width of about 100 μm to about 200 μm. And also, the second through groove TH2 partially exposes the top surface of the back electrode layer 200.

Figure 5:
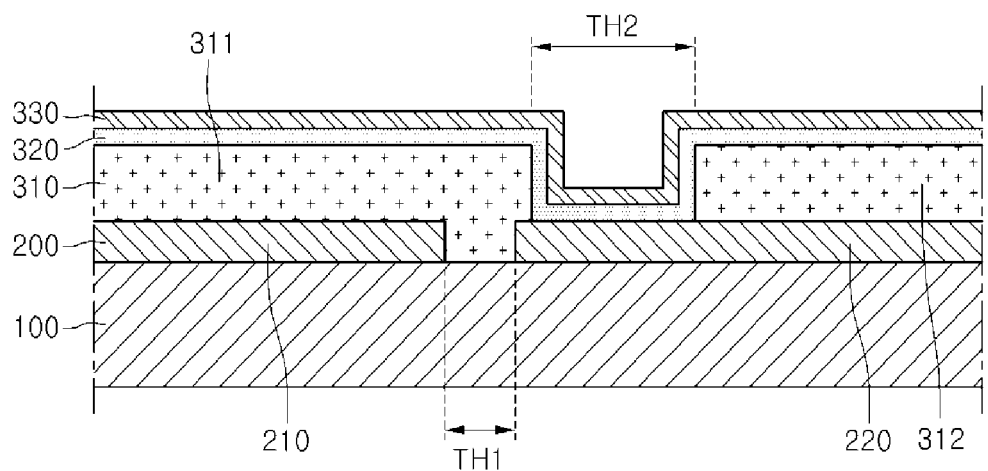

Referring to FIG. 5, cadmium sulfide is deposited on the top surface of the light absorption layer 310 and the inner surface of the second through groove TH2 using a sputtering process or a chemical bath deposition (CBD) method to form the first buffer layer 320.

Hereinafter, zinc oxide is deposited on the first buffer layer 320 through a sputtering process to form the second buffer layer 330.

Figure 6:
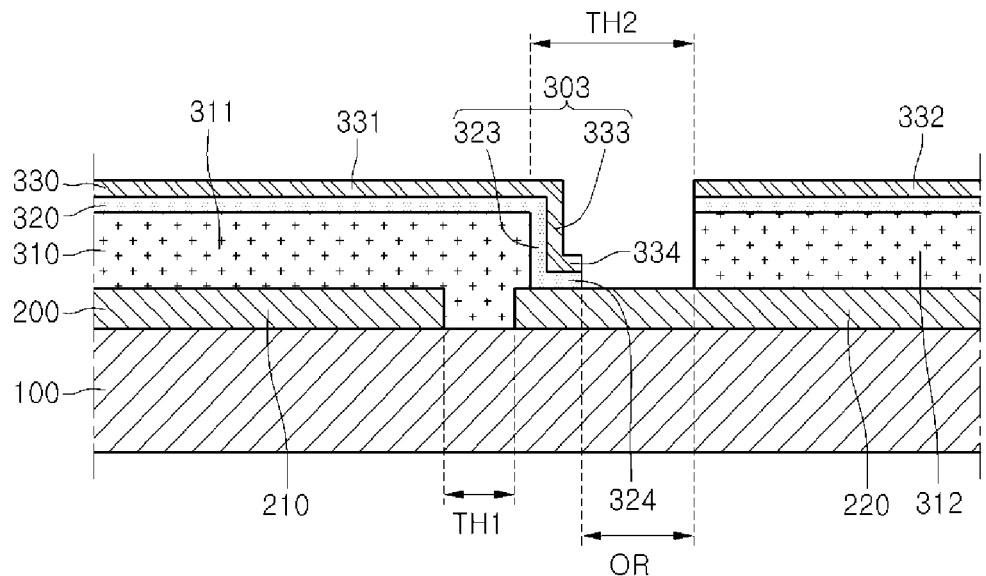

Referring to FIG. 6, the first buffer layer 320 and the second buffer layer 330 is partially removed through a laser or mechanical scribing to form an open region OR. The open region OR partially overlaps the second through groove TH2. That is, the open region OR is dislocated from the second through groove TH2.

Thus, a barrier film 303 is formed on each of the side surfaces of the light absorber parts 311, 312, . . . , and a dummy part is formed on the back electrode 200.

That is, in a process of forming the open region OR, a position for the scribing or laser patterning is difficult to be accurately controlled to leave the barrier film 303. Thus, since the second buffer layer 330 is patterned to leave a little margin, the dummy part is formed.

Figure 7:
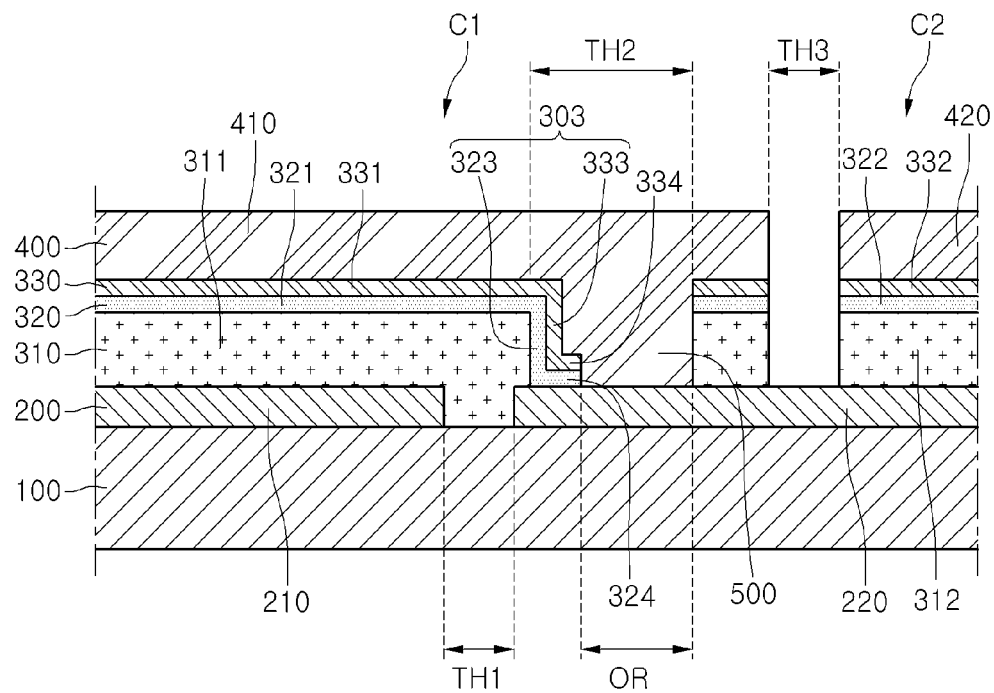

Referring to FIG. 7, a window layer 400 is formed on the second buffer layer 330. In this case, the second through groove is filled with a material forming the window layer 400.

To form the window layer 400, a transparent conductive material is stacked on the second buffer layer 330. The transparent conductive material is filled with the second through groove TH2. For example, the transparent conductive material may be aluminum-doped zinc oxide (AZO).

Thus, the connector part 500 which extends from the window layer 400 and is contact with the back electrode layer 200 is formed on the inner surface of the second through groove TH2.

Hereinafter, the window layer 400 is partially removed to form a third through groove TH3. That is, the window layer 400 is patterned to define a plurality of windows 410, 420, . . . and a plurality of cells C1, C2, . . . .

The third through groove TH3 may have a width of about 80 µm to about 200 µm.

In this way, the barrier film can be formed, thereby providing a solar cell apparatus having a high efficiency.

Figure 8:
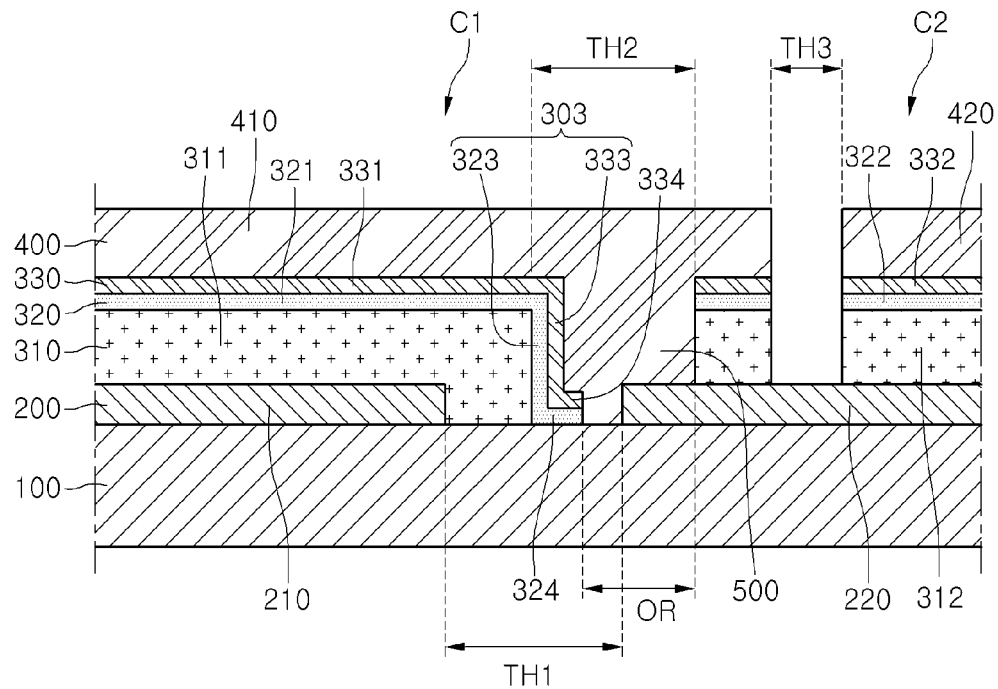
FIG. 8 is a cross-sectional view illustrating a solar cell apparatus according to another embodiment.

FIG. 8 is a cross-sectional view illustrating a solar cell apparatus according to another embodiment. The present embodiment refers to the above-described embodiments and describes a first through groove and a second though groove additionally. That is, the description of the previous embodiment may be incorporated in the following description of the present embodiment except for different parts.

Referring to FIG. 8, a first through groove TH1 and a second through groove TH2 overlap each other. Thus, a barrier film 303 entirely covers the side surfaces of light absorber parts 311, 312, . . . . And also, dummy parts 324 and 334 are in contact with a support substrate 100.

That is, a first buffer layer 320 and a second buffer layer 330 may extend inside the first through groove TH1. Furthermore, the first buffer layer 320 and the second buffer layer 330 may be disposed on an inner surface of the first through groove TH1.

The barrier film 303 and the dummy parts 324 and 334 are disposed between back electrodes 210, 220, . . . . That is, the barrier film 303 and the dummy parts 324 and 334 are disposed on the inner surface of the first through groove TH1.

Since the barrier film 303 entirely cover the side surfaces of the light absorber parts 311, 312, . . . , the barrier film 303 can easily block leakage currents between the back electrodes 210, 220, . . . . That is, the first light absorber part 311 is efficiently insulated from the second light absorber part 312 by the barrier film 303.

Furthermore, the solar cell apparatus according to the present invention can easily block leakage currents using the barrier film 303, thereby decreasing a width of the first through groove TH1. Thus, the solar cell apparatus according to the present embodiment can reducing a dead zone and have an enhanced power generation efficiency.

Figure 9:
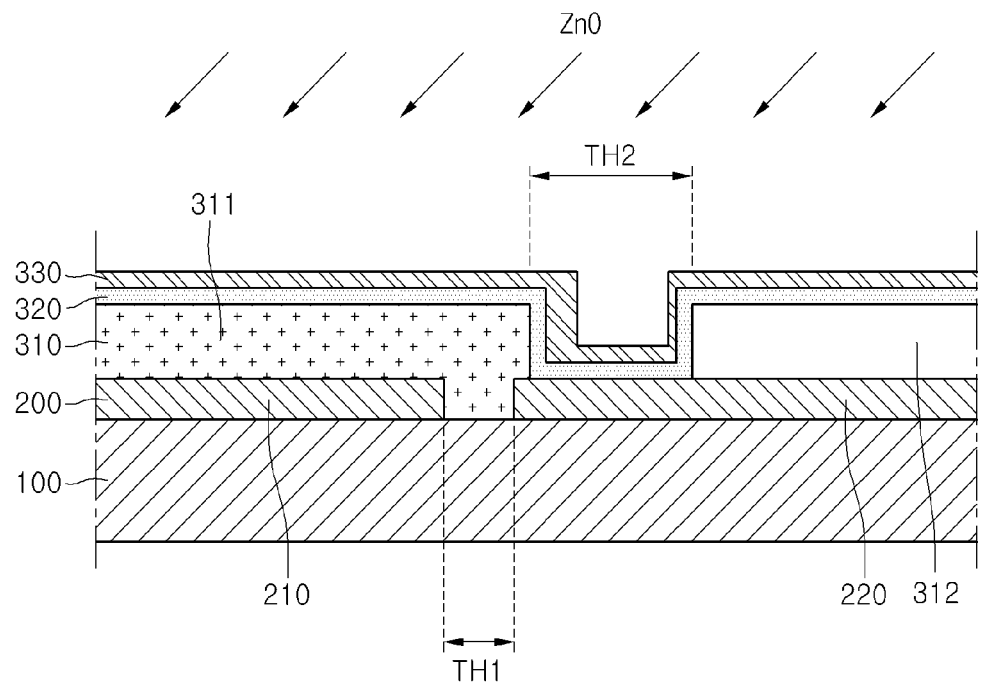
FIGS. 9 to 11 are cross-sectional views illustrating a method of manufacturing a solar cell apparatus according to another embodiment.
Figure 10:
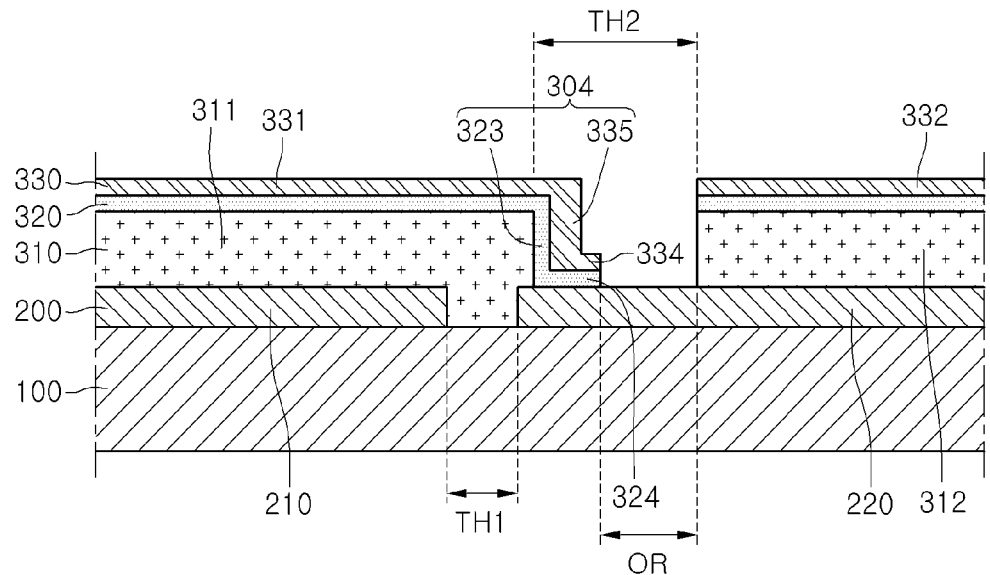
Figure 11:
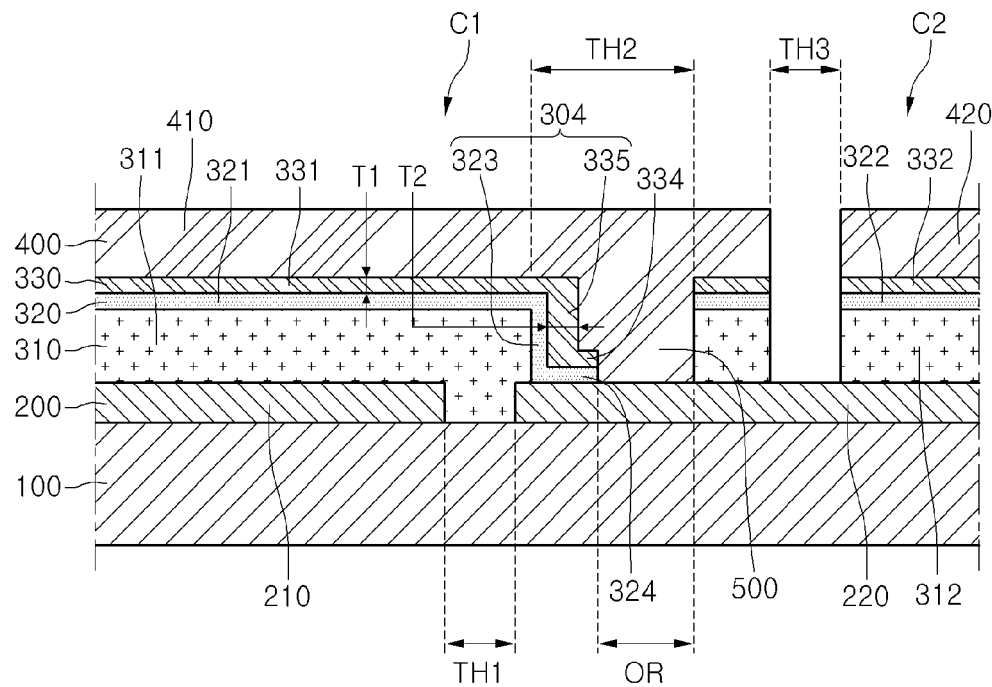

FIGS. 9 to 11 are cross-sectional views illustrating a method of manufacturing a solar cell apparatus according to another embodiment. The present embodiment refers to the above described solar cell apparatus and the manufacturing method thereof. That is, the description of the previous embodiment may be incorporated to a description of the manufacturing method of the present embodiment except for different parts.

Referring to FIG. 9, cadmium sulfide is deposited on the top surface of the light absorption layer 310 and the inner side and bottom surfaces of the second through groove TH2 using a sputtering process or a chemical bath deposition (CBD) method to form the first buffer layer 320.

Hereinafter, gallium-doped zinc oxide, gallium-doped tin oxide, or impurity-undoped zinc oxide is deposited on the first buffer layer 320 through a sputtering process to form the second buffer layer 330.

In this case, a material for forming the second buffer layer 330 may be deposited on the first buffer layer 320 in an inclined direction with respect to the support substrate 100. For example, a direction in which the material for forming the second buffer layer 330 is deposited is sloped about 10° to about 40° with respect to the support substrate 100.

The second buffer layer 330 is described as being formed through an oblique deposition process, but the present disclosure is not limited thereto. That is, the first buffer layer 320 may be formed through the oblique deposition process, or both the first buffer layer 320 and the second buffer layer 330 may be formed through the oblique deposition process.

Thus, a second barrier film 335 may be formed to a large thickness T2. That is, the second barrier film 335 may have a thickness greater than the thickness T1 of the second buffer layer 335 formed on the top surface of the light absorption layer 310. That is, in the second buffer layer 330, a thickness T1 of second buffer layers 331 and 332 formed on the light absorption layer 310 may be less than a thickness T2 of a second buffer layer 335 formed on the side surface of the light absorber part 311.

Referring to FIG. 10, the first buffer layer 320 and the second buffer layer 330 is partially removed through a laser or mechanical scribing to form an open region OR. The open region OR partially overlaps the second through groove TH2. That is, the open region OR is dislocated from the second through groove TH2.

Referring to FIG. 11, a window layer 400 and a third through groove TH3 are formed on the second buffer layer 330.

The solar cell apparatus according to the present embodiment includes a relatively thick barrier film 304, i.e., a second barrier film 335. Thus, insulation of side surfaces of the light absorber part 311 may be further enhanced.

Accordingly, the solar cell apparatus according to the present embodiment further improves connection between cells and has enhanced efficiency of power generation.

Accordingly, the solar cell apparatus according to an embodiment has a barrier film. A side surface of a light absorber part may be insulated by the barrier film. Thus, the solar cell apparatus according to an embodiment prevents currents from being leaked through the side surface of the light absorber part.

Accordingly, the solar cell apparatus according to an embodiment prevents leakage currents and has enhanced efficiency of power generation.

In particular, the barrier film may be formed of impurity-undoped zinc oxide and cadmium sulfide, and thus the barrier film has a high resistance. Accordingly, the barrier film can efficiently prevent leakage currents.

And also, the buffer and barrier film may be formed through an oblique deposition process. Thus, the barrier film may be relatively thicker than the buffer. Accordingly, the solar cell apparatus according to an embodiment more efficiently prevents leakage currents and has enhanced efficiency of power generation.

Features, features, structures, and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The solar cell apparatus according to embodiments may be used in a solar photovoltaic field.

What is claimed is:

1. A solar cell apparatus comprising:
   a support substrate;
   a back electrode layer disposed on the support substrate, comprising a first back electrode, a second back electrode, and a first through groove formed between the first back electrode and the second back electrode;
   a light absorber part disposed on the first back electrode and extended into the first through groove;
   a buffer disposed on a top surface of the light absorber part;
   a barrier film extended from the buffer and disposed on a side surface of the light absorber part;
   a window disposed on the buffer; and
   a connector part extended from the window and in direct physical contact with a top surface of the second back electrode
   wherein the buffer comprises:
   a first buffer disposed on the top surface of the light absorber part, and
   a second buffer disposed on the first buffer, and wherein the barrier film comprises:
   a first barrier film extended from the first buffer; and
   a second barrier film extended from the second buffer.

2. The solar cell apparatus of claim 1, wherein the barrier film is disposed between the light absorber part and the connector part.

3. The solar cell apparatus of claim 1, further comprising a dummy part extended from the barrier film along a part of the top surface of the second back electrode.

4. The solar cell apparatus of claim 1, wherein the first barrier film is formed integrally with the first buffer, and the second barrier film is formed integrally with the second buffer.

5. The solar cell apparatus of claim 1, wherein the first barrier film comprises cadmium sulfide, and the second barrier film comprises impurity-undoped zinc oxide.

6. The solar cell apparatus of claim 1, wherein the barrier film is thicker than the buffer.

7. The solar cell apparatus of claim 1, wherein the second buffer and the window are formed with different material.

8. The solar cell apparatus of claim 1, wherein the first barrier film and the first buffer are formed with a same material, and the second barrier film and the second buffer are formed with a same material.

* * * * *